United States Patent [19]

Martin et al.

[11] 3,892,263

[45] July 1, 1975

[54] AXIAL COMPONENT LEAD STRAIGHTENER

[75] Inventors: Lewis P. Martin; Lynn E. Trent, both of Huntsville, Ala.

[73] Assignee: GTE Automatic Electric Laboratories Incorporated, Northlake, Ill.

[22] Filed: Sept. 13, 1974

[21] Appl. No.: 505,807

[52] U.S. Cl. .................... 140/147

[51] Int. Cl. .................... B21f 1/02

[58] Field of Search .................... 140/147; 72/DIG. 10

[56] References Cited

UNITED STATES PATENTS 2,878,841 3/1959 Peterson et al. .................... 140/147

*Primary Examiner*—Lowell A. Larson

[57] ABSTRACT

Electrical components with axial leads are fed into a lead straightening apparatus having two opposed counter rotating helical straightening elements which operate to comb the leads straight. The straightening elements are then withdrawn to release the component.

10 Claims, 3 Drawing Figures

AXIAL COMPONENT LEAD STRAIGHTENER

BACKGROUND OF THE INVENTION

1. Field of the Invention

The present invention relates to apparatus for straightening leads which extend axially from electrical components.

2. Description of the Prior Art

A wide variety of electrical components are fabricated having leads extending axially therefrom. In the subsequent handling of such components the leads are subject to being bent from their desired axial orientation. When it is desired to use automated equipment to insert electrical components into printed wiring cards it is necessary that the axial component leads be straight. It is therefore necessary that the component leads be straightened prior to feeding them into taping equipment before automatic insertion.

Prior to the present invention various wire straightening machines have been devised and of those which operate to straighten axial leads, U.S. Pat. No. 3,739,819 which issued to Robert R. Swanson on June 19, 1973 is considered representative. In such a system the component leads are gripped between a rotating roller and a pad such that the leads are forced straight. Such apparatus is limited in its ability to straighten excessively bent leads; i.e., leads bent on the order of 180° may be even further bent by the straightening apparatus. An additional prior art apparatus of this type is described in U.S. Pat. No. 3,744,535.

OBJECTS AND SUMMARY OF THE INVENTION

From the foregoing discussion it will be understood that among the various objectives of the present invention are the provision of an improved axial lead straightening apparatus and the provision of an apparatus of such character which efficiently straightens component leads without regard to the degree to which such leads are bent.

These and other objectives of the invention are achieved by providing two opposed counter-rotating helical wire straightening elements into which components having bent leads are fed. As the straightening elements rotate the leads are drawn into the center of the helix and thereby straightened. Once the leads are fully within the helices the straightening elements are axially withdrawn straightening the leads and releasing the component.

The foregoing as well as other objects, features and advantages of the present invention will become more easily understood from the detailed description taken in conjunction with the appended drawings.

DESCRIPTION OF THE PREFERRED EMBODIMENT

Figure 1:
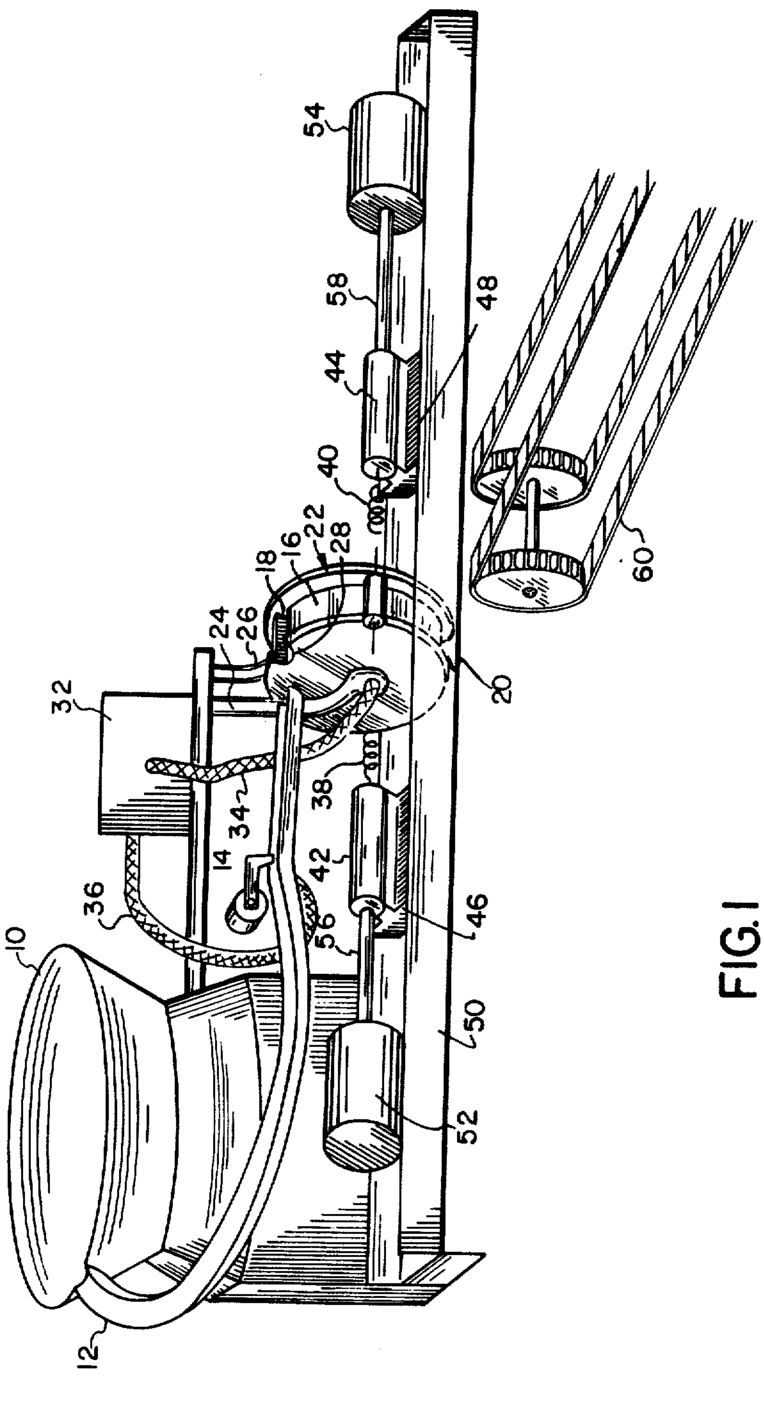
FIG. 1 is a simplified elevation view of a lead straightening apparatus in accordance with the principles of the present invention.

With reference now to FIG. 1 there is shown a conventional vibratory feeder bowl 10 which disentangles and orients the axial lead components and feeds them individually to a chute 12 along which they advance to an escapement mechanism 14. It is preferred in the practice of the invention that the chute 12 extend upwardly from the feeder bowl 10 to a peak 12 and then downwardly to the escapement mechanism 14. In this manner as the components pass over the peak they are separated from one another. Alternatively a motor driven friction wheel (not shown) may be used to pull the components apart from one another. The escapement may be, for example, a solenoid operated lever which serves to stop the advance of the components along the chute 12. The chute terminates at an indexing vacuum wheel 16 which is provided with a plurality of transverse depressions 18 adapted to receive the body of axial leaded components. The vacuum wheel is rotatably mounted between two stationary retaining plates 20 and 22, which are in turn supported by arms 24 and 26 respectively. The retaining plate 20 which is adjacent the end of chute 12 has a notch 28 in alignment with the end of chute 12 and with which the depressions 18 in the vacuum wheel 16 may be indexed.

Each of the depressions 18 in the vacuum wheel are provided with vacuum ports 30 which are internally coupled to a vacuum pump 32 via pneumatic hose 34. As a depression is indexed into alignment with the end of chute 12, a blast of air is provided via air jet 36 to drive an individual component along chute 12 and into the depression. The component body is retained in the depression under the influence of the vacuum and the axial leads thereof extend beyond the stationary retaining plates 20 and 22. The vacuum wheel 16 is then indexed again to advance the component to the lead straightening position.

Disposed in alignment along an axis which intersects the periphery of the retaining plates 20 and 22 are first and second helical lead straightening elements 38 and 40 which are similar in appearance to a common corkscrew. The lead straightening elements 38 and 40 are driven in counter-rotation with respect to one another by first and second motors 42 and 44 which are mounted to axially translatable base elements 46 and 48. The base elements are movable within a supporting channel 50 and are coupled to first and second fixed pneumatic pistons 52 and 54 by respective piston rods 56 and 58.

When the vacuum wheel bearing the axial leaded component is indexed to the lead straightening position the counter-rotating lead straightening elements 38 and 40 are driven by the pistons 52 and 54 toward the component. The ends of the lead straightening elements engage the component leads and due to their rotation and helical configuration the leads are drawn into the center of the helices and thus combed straight. Further, due to the counter-rotation of the lead straightening elements the component does not rotate while being restrained in translation by the edges of the stationary retaining plates 20 and 22.

After a preselected number of revolutions or amount of time the lead straightening elements 38 and 40 are axially withdrawn and the vacuum wheel is again indexed. The vacuum is then released and the component with straightened leads is deposited on any convenient type of conveyor 60 for transport to a component insertion machine (not shown). A chain type of conveyor is shown and is preferred since the component leads tend to be retained in a transverse orientation.

Figure 2:
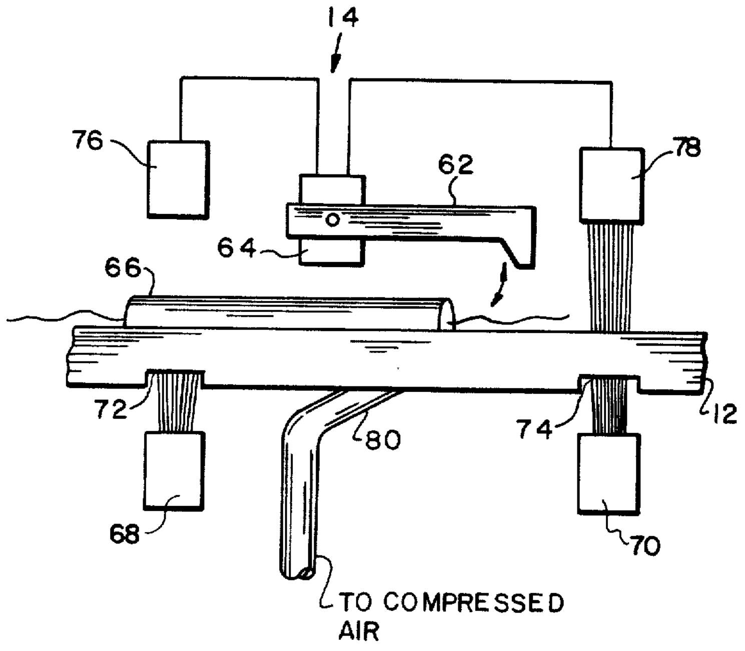
FIG. 2 is a more detailed illustration of an escapement mechanism of use with the apparatus of FIG. 1.

FIG. 2 illustrates in more detail one type of escapement arrangement 14 which may be used to advantage in the practice of the present invention. The escapement may include a simple pawl 62 driven by a solenoid 64 into and out of the path of the electrical components 66 as they advance along the feeder chute 12. To determine the position of a given component first and second light sources 68 and 70 are positioned beneath the chute 12 in alignment with first and second apertures 72 and 74. First and second photocells 76 and 78 are positioned in alignment with the light sources. When an electrical component is positioned to be retained by the escapement mechanism light from both sources 68 and 70 will be received by both photocells 76 and 78 and the solenoid 64 operated to drive the pawl 62 downwardly. When the vacuum wheel 16 of FIG. 1 is indexed such that a depression 18 is ready to receive an electrical component, the pawl is raised to release the component which is driven by a blast of air from an air jet 80 down the chute 12 and onto the wheel. As the component 66 clears the escapement it will block the light from source 70 to photocell 78 and the following component will advance to block the light from source 68 to photocell 76 thus providing the information to initiate return of the pawl 62 toward the chute 12.

Figure 3:
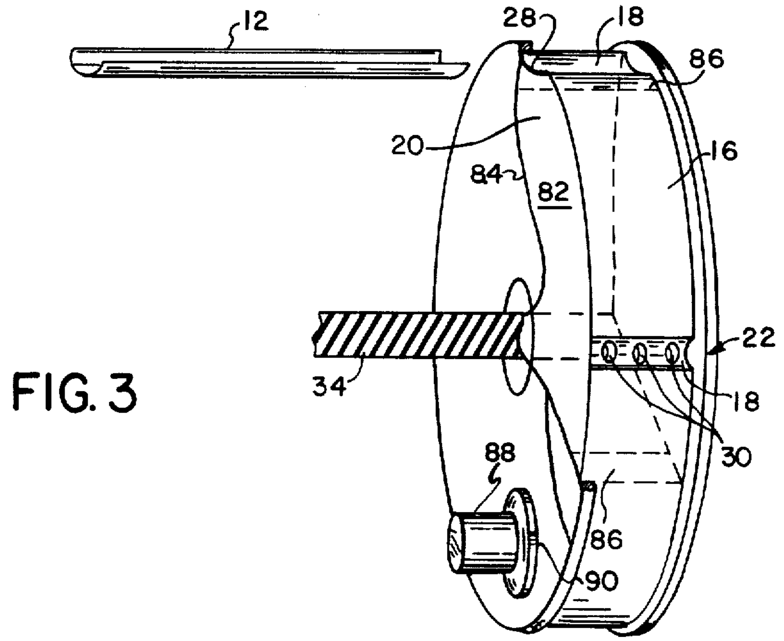
FIG. 3 is a more detailed view of the indexing vacuum wheel shown in FIG. 1.

FIG. 3 illustrates a vacuum wheel arrangement of utility in the practice of the present invention, and wherein elements common to those shown in FIG. 1 are identified by like reference characters. It will be understood that it is only necessary that a vacuum need only be provided from the point in the vacuum wheel rotation where the component is transferred from the feeder chute 12 into the depression 18 until the lead straightening has been effected. To this end the pneumatic hose 34 terminates in a chamber 82 defined at the sides by the stationary retaining plates 20 and 22, at the periphery by the rotatable vacuum wheel 16 and at the interior by wall 84. The ends of the wall 84 may be provided with flexible wiper elements 86 such that the vacuum is retained as the wheel 16 rotates. The wheel 16 may be driven in rotation by any convenient means and an electric motor 88 mounted to retaining plate 20 is illustrated as driving a friction wheel 90 which engages the interior surface of the vacuum wheel 16. A suitable axial type of drive arrangement could as well be employed.

The logic circuitry used to coordinate the various functions of the Applicants' lead straightening apparatus is not shown but will be readily apparent to those skilled in the art. Since any of a variety of arrangements would be of practical utility in the practice of the invention the details of such are not considered a part hereof.

From the preceding discussion it will be seen that the Applicants have provided a new and novel apparatus for straightening the leads of axial leaded electrical components. Since certain changes in the above-described construction will become apparent to those skilled in the art, it is intended that all matter contained in the foregoing description or shown in the various views of the appended drawings shall be interpreted as being illustrative and not taken in a limiting sense.

Having described what is new and novel and desired to secure by Letters Patent, what is claimed is:

1. Apparatus for straightening the leads extending longitudinally from axial leaded electrical components, said apparatus comprising first and second closed helical lead straightening elements disposed on a common longitudinal axis, means for driving said first and second lead straightening elements in counter-rotation with respect to one another, means for conveying said electrical components into axial alignment with said first and second lead straightening elements and retaining said components in axial translation, means for driving said first and second lead straightening elements along said longitudinal axis such that the ends thereof engage said component leads whereby said leads are drawn into said straightening elements due to the rotation thereof, and means for axially withdrawing said lead straightening elements from said electrical components to thereby straighten said leads and release said components.

2. Apparatus as recited in claim 1 wherein said coneying means comprises a vacuum source, a vacuum wheel rotatably disposed with the periphery thereof intersecting the longitudinal axis of said lead straightening elements, the interior of said wheel communicating with said vacuum source, the edge of said vacuum wheel having a plurality of transverse depressions adapted to receive said electrical components such that the leads thereof extend outwardly from said wheel, each said depression having a vacuum port which communicates with the interior of said wheel, means for feeding said electrical components singly into said depressions in said vacuum wheel, and means for driving said vacuum wheel in rotation to thereby bring said electrical components into axial alignment with said lead straightening elements.

3. Apparatus as recited in claim 2 wherein said feeding means comprises means for disentangling a multiplicity of electrical components, orienting said components in a common orientation and dispelling said components individually therefrom, a chute for receiving said components from said disentangling, orienting and dispelling means, said chute extending to said vacuum wheel, an escapement mechanism disposed with respect to said chute such as to selectively interrupt movement of said components along said chute, and selectively actuable means for driving components singly from said escapement to said vacuum wheel.

4. Apparatus as recited in claim 3 wherein said disentangling, orienting and dispelling means comprises a vibratory feeder bowl

5. Apparatus as recited in claim 3 wherein said escapement mechanism comprises a pawl disposed above said chute and means for driving said pawl toward said chute to interrupt movement of said components and away from said chute to release said components.

6. Apparatus as recited in claim 5 wherein said component driving means comprises a source of compressed air, an air jet disposed with respect to said chute such as to drive said components from said escapement mechanism when said pawl is driven away from said chute, and means for selectively releasing air from said jet.

7. Apparatus as recited in claim 2 wherein said vacuum wheel comprises first and second fixed, substantially circular retaining plates, and an open cylindrical wheel rotatably mounted in vacuum tight engagement between said retaining plates, the retaining plate proximate said component feeding means having a notch in the periphery thereof in alignment with said feeding means to permit passage of said component onto said wheel.

8. Apparatus as recited in claim 2 further including means for releasing the vacuum from the ports of a depression containing a component after said lead straightening elements have been withdrawn to thereby release said components.

9. Apparatus as recited in claim 3 further including means for detecting the position of said components in said chute with respect to said escapement mechanism and for controlling the selective interruption of the movement of said components along said chute.

10. Apparatus as recited in claim 9 wherein said chute is provided with first and second apertures therethrough one on either side of said escapement mechanism, and said detecting means comprises first and second light sources and first and second corresponding photocells, one light source and photocell disposed in alignment with one another on opposed sides of said chute and in alignment with a respective aperture on either side of said escapement mechanism such that a component moving along said chute interrupts the light from one and then the other of said sources, said photocells producing an output signal when light from the corresponding source is incident thereon and being coupled to said escapement mechanism to control the operation thereof.

* * * * *